US012622088B2

(12) United States Patent
Ye et al.

(10) Patent No.: US 12,622,088 B2
(45) Date of Patent: May 5, 2026

(54) FUNCTIONAL POLYCRYSTALLINE SILICON TUNNELING SILICON OXIDE PASSIVATED CONTACT STRUCTURE AND PREPARATION METHOD THEREOF

(71) Applicant: NINGBO INSTITUTE OF MATERIALS TECHNOLOGY AND ENGINEERING, CHINESE ACADEMY OF Sciences, Ningbo (CN)

(72) Inventors: Jichun Ye, Ningbo (CN); Zunke Liu, Ningbo (CN); Yuheng Zeng, Ningbo (CN); Ruoyi Wang, Ningbo (CN); Hongkai Zhou, Ningbo (CN); Zhenhai Yang, Ningbo (CN); Wei Liu, Ningbo (CN); Mingdun Liao, Ningbo (CN)

(73) Assignee: Ningbo Institute of Materials Technology and Engineering, Chinese Academy of Sciences, Ningbo (CN)

( * ) Notice: Subject to any disclaimer, the term of this patent is extended or adjusted under 35 U.S.C. 154(b) by 0 days.

(21) Appl. No.: 19/254,087

(22) Filed: Jun. 30, 2025

(65) Prior Publication Data

US 2025/0331329 A1    Oct. 23, 2025

Related U.S. Application Data

(63) Continuation of application No. PCT/CN2024/137736, filed on Dec. 9, 2024.

(30) Foreign Application Priority Data

Dec. 29, 2023    (CN) .......................... 202311841918.4

(51) Int. Cl.
H10F 71/00        (2025.01)
H10F 77/30        (2025.01)

(52) U.S. Cl.
CPC ......... H10F 71/129 (2025.01); H10F 77/311 (2025.01)

(58) Field of Classification Search
CPC .... H10F 71/129; H10F 71/131; H10F 77/311; H10F 77/315
See application file for complete search history.

(56) References Cited

U.S. PATENT DOCUMENTS

| | | | |
|---|---|---|---|
| 2012/0055547 A1* | 3/2012 | Schultz-Wittmann | ...................... H10F 10/165 136/258 |
| 2015/0101662 A1 | 4/2015 | Seutter et al. | |
| 2016/0155877 A1* | 6/2016 | Chung | ............... H10F 77/1642 438/72 |

FOREIGN PATENT DOCUMENTS

| | | | | |
|---|---|---|---|---|
| CN | 102356474 A | * | 2/2012 | ........... H10F 71/103 |
| CN | 111710743 A | * | 9/2020 | ........... H10F 71/121 |

(Continued)

OTHER PUBLICATIONS

English machine translation of Sheng et al. (CN 102356474) published Feb. 15, 2012.*

(Continued)

*Primary Examiner* — Christina Chern
(74) *Attorney, Agent, or Firm* — Bayramoglu Law Offices LLC

(57)    ABSTRACT

A functional polycrystalline silicon tunneling silicon oxide passivated contact structure (TOPCon) and a preparation method thereof are provided. The functional polycrystalline silicon tunneling silicon oxide passivated contact structure includes a crystalline silicon substrate, a nano silicon oxide, and a functional polycrystalline silicon structure laminated in sequence. The functional polycrystalline silicon structure includes a carbon and nitrogen co-doped polycrystalline silicon layer, or alternating layers of a carbon-doped (Continued)

polycrystalline silicon layer and a nitrogen-doped polycrystalline silicon layer. The present invention uses doping engineering to prepare new polycrystalline silicon with different functions, namely, carbon-doped polycrystalline silicon, nitrogen-doped polycrystalline silicon, and carbon and nitrogen co-doped polycrystalline silicon, and forms a functional polycrystalline silicon structure, exerting different functional effects of carbon and nitrogen doped atoms, and simultaneously realizing passivation in the bulk and surface of the silicon wafer, thereby obtaining a TOPCon structure with ultra-high passivation performance.

20 Claims, 6 Drawing Sheets

(56)                    References Cited

FOREIGN PATENT DOCUMENTS

| CN | 113314630 A | * | 8/2021 | ........... H10F 71/121 |
|----|-------------|---|--------|-------------------------|
| CN | 115274890 A |   | 11/2022 |                        |

| CN | 217881546 U |   | 11/2022 |                        |
|----|-------------|---|--------|-------------------------|
| CN | 116417525 A |   | 7/2023 |                         |
| CN | 117293195 A |   | 12/2023 |                        |
| CN | 117936597 A |   | 4/2024 |                         |
| CN | 118053936 A | * | 5/2024 | ........... H10F 71/129 |

OTHER PUBLICATIONS

English machine translation of Ye et al. (CN 115274890) published Nov. 1, 2022.*

English machine translation of Liu et al. (CN 118053936) published May 17, 2024.*

English machine translation of Zeng et al. (CN 113314630) published Aug. 27, 2021.*

English machine translation of Shou et al. (CN 111710743) published Sep. 25, 2020.*

* cited by examiner

FUNCTIONAL POLYCRYSTALLINE SILICON TUNNELING SILICON OXIDE PASSIVATED CONTACT STRUCTURE AND PREPARATION METHOD THEREOF

CROSS REFERENCE TO THE RELATED APPLICATIONS

This application is a continuation application of International Application No. PCT/CN2024/137736, filed on Dec. 9, 2024, which is based upon and claims priority to Chinese Patent Application No. 202311841918.4, filed on Dec. 29, 2023, the entire contents of which are incorporated herein by reference.

TECHNICAL FIELD

The present invention relates to the technical field of solar cells, and in particular to a functional polycrystalline silicon tunneling oxide passivated contact structure and a preparation method thereof.

BACKGROUND

Tunnel oxide passivated contact (TOPCon) technology is a representative passivating contact technology. Its key feature is to grow an ultra-thin nano silicon oxide ($SiO_x$) layer on the surface of the silicon wafer to eliminate the dangling bonds on the surface and prepare a layer of heavily doped polycrystalline silicon on the ultra-thin silicon oxide to achieve a field passivation effect. Thanks to the TOPCon structure's excellent passivation performance, its mass-produced cell efficiency has now reached more than 25%; coupled with the compatibility of the production process, the planned production capacity of TOPCon cells is currently increasing rapidly. The TOPCon technology has become the mainstream technology for the expansion of industrial silicon cell production.

However, in terms of efficiency improvement, the TOPCon technology currently shows certain limitations. First, the passivation performance of the TOPCon structure based on conventional polycrystalline silicon is slightly inferior to that of another representative passivating contact technology, heterojunction (HJT), and the passivation performance of the TOPCon structure needs to be further improved. Second, according to research, the corresponding silicon wafer thickness for a crystalline silicon solar cell to achieve the highest photoelectric conversion efficiency is about 110 m. In the case of a relatively thin silicon wafer, the cell performance is more sensitive to surface recombination, that is, more dependent on surface passivation. Therefore, how to further improve the surface passivation capability is an important direction for the development of TOPCon technology. In addition, studies have shown that the improvement of silicon cell efficiency will be limited by the quality of the silicon wafer, that is, the minority carrier lifetime. For example, the theoretical efficiency of a cell with a silicon wafer minority carrier lifetime of 15 ms is at least 1% higher than that of a cell with a minority carrier lifetime of 4.5 ms. Therefore, improving the silicon wafer minority carrier lifetime is also conducive to improving cell efficiency.

SUMMARY

In view of the shortcomings of the prior art, the purpose of the present invention is to develop a new tunneling oxide passivated contact structure that can simultaneously improve the surface passivation performance and minority carrier lifetime of the silicon wafer.

To solve the above problem, the present invention provides a functional polycrystalline silicon tunneling silicon oxide passivated contact structure, including a crystalline silicon substrate, a nano silicon oxide, and a functional polycrystalline silicon structure laminated in sequence, where the functional polycrystalline silicon structure includes a carbon and nitrogen co-doped polycrystalline silicon layer or alternating layers of a carbon-doped polycrystalline silicon layer and a nitrogen-doped polycrystalline silicon layer.

The present invention utilizes doping engineering to prepare new types of polycrystalline silicon with different functions, namely, carbon-doped (C) polycrystalline silicon, nitrogen-doped (N) polycrystalline silicon and carbon-nitrogen co-doped polycrystalline silicon layer, and form a functional polycrystalline silicon structure to exert the different functional effects of carbon and nitrogen doped atoms, while achieving passivation in the bulk and surface of the silicon wafer, thereby obtaining a TOPCon structure with ultra-high passivation performance, which has ultra-high minority carrier lifetime ($\tau_{eff}$), implicit open-circuit voltage ($iV_{oc}$), and ultra-low surface recombination current ($J_0$), and can enhance the mechanical strength of the silicon wafer to a certain extent.

Furthermore, the functional polycrystalline silicon structure includes an active dopant atom, and the active dopant atom is phosphorus or boron. Doping the polycrystalline silicon layer with n-type or p-type active dopant atoms can achieve an excellent field passivation effect.

Furthermore, a near-surface region of the crystalline silicon substrate adjacent to the nano silicon oxide includes nitrogen, carbon, hydrogen, and phosphorus/boron elements; a nitrogen concentration at a surface of the crystalline silicon substrate is higher than $1 \times 10^{20}$ $cm^{-3}$, a carbon concentration is higher than $1 \times 10^{20}$ $cm^{-3}$, a hydrogen concentration is higher than $1 \times 10^{19}$ $cm^{-3}$, a phosphorus concentration range is $1 \times 10^{17}$-$5 \times 10^{20}$ $cm^{-3}$, or a boron concentration range is $0.5 \times 10^{17}$-$1 \times 10^{20}$ $cm^{-3}$; and the concentration of the nitrogen, carbon, hydrogen, and phosphorus/boron elements in the crystalline silicon substrate gradually decreases when a depth increases.

Furthermore, a carbon atom doping concentration of the carbon and nitrogen co-doped polycrystalline silicon layer is 0.1 at %-50 at %, a nitrogen atom doping concentration is 0.1 at %-50 at %, a carbon atom doping concentration of the carbon-doped polycrystalline silicon layer is 0.1 at %-50 at %, and a nitrogen atom doping concentration of the nitrogen-doped polycrystalline silicon layer is 0.1 at %-50 at %.

Furthermore, a distribution of carbon atoms and nitrogen atoms in the carbon and nitrogen co-doped polycrystalline silicon layer is uniform doping or gradient doping, a distribution of the carbon atoms in the carbon-doped polycrystalline silicon layer is uniform doping or gradient doping, and a distribution of the nitrogen atoms in the nitrogen-doped polycrystalline silicon layer is uniform doping or gradient doping.

Furthermore, a thickness of the carbon and nitrogen co-doped polycrystalline silicon layer is 1 nm-2000 nm, a thickness of the carbon-doped polycrystalline silicon layer is 1 nm-1000 nm, and a thickness of the nitrogen-doped polycrystalline silicon layer is 1 nm-1000 nm.

The mechanism of action of the functional polycrystalline silicon structure is as follows: C atoms will enter the bulk of the silicon wafer after diffusion, and after entering the silicon bulk, C atoms can effectively avoid the formation of cluster defects such as phosphorus clusters and boron clusters; in addition, C atoms will inhibit the formation of oxygen thermal donor defects or make thermal donors lose electrical activity; and C atoms have a strong ability to capture H atoms, so more H atoms in the bulk can also passivate more defects; in short, the above mechanisms are helpful to reduce the density of the defect state in the silicon bulk. N atoms can also enter the bulk of the silicon wafer after diffusion, and N impurities in the bulk of the crystalline silicon can effectively inhibit the generation of vortex defects and D defects in silicon materials; in addition, N impurity atoms can effectively pin dislocations and prevent them from moving, so the mechanical strength of the silicon wafer can be improved; and N atoms also have a strong ability to capture H atoms, so that more H atoms can remain in the bulk to passivate defect states; more importantly, N atoms will be enriched to a certain extent at the interface of nano-silicon oxide, thus greatly increasing the concentration of H atoms at the interface, thereby passivating more defect states and achieving a lower density of the interface state. In short, by utilizing carbon and nitrogen co-doped polycrystalline silicon or C-doped and N-doped polycrystalline silicon laminated structures, the different functions of C and N atoms can be brought into play, while passivation inside the bulk and on the surface of the silicon is achieved, the recombination current is reduced, the minority carrier lifetime is increased, and the mechanical strength of the silicon wafer is improved.

Furthermore, a conventional polycrystalline silicon layer is further provided on the functional polycrystalline silicon structure, and the material of the conventional polycrystalline silicon layer is a polycrystalline silicon not doped with carbon or nitrogen. Adding another layer of conventional polycrystalline silicon on the carbon-doped and nitrogen-doped functional polycrystalline silicon structure can improve the contact performance.

The present invention also provides a preparation method of the above functional polycrystalline silicon tunneling silicon oxide passivated contact structure, including the following steps:

S1, cleaning the crystalline silicon substrate;

S2, depositing the nano silicon oxide on a surface of the crystalline silicon substrate;

S3, depositing a carbon and nitrogen co-doped amorphous silicon layer or alternating layers of a carbon-doped amorphous silicon layer and a nitrogen-doped amorphous silicon layer on a surface of the nano silicon oxide; and S4, performing a high-temperature annealing to crystallize an amorphous silicon to form the functional polycrystalline silicon structure and pushing carbon atoms and nitrogen atoms into a bulk of the crystalline silicon substrate.

Furthermore, in step S4, the temperature of the high-temperature annealing is 800° C.-1100° C. Selecting a suitable temperature for the high-temperature annealing can activate the active dopant while pushing the C and N atoms of the functional polycrystalline silicon structure into the bulk of the crystalline silicon, thereby achieving simultaneous passivation of the bulk and the surface.

Furthermore, in step S3, the amorphous silicon layer is deposited in situ by a plasma-enhanced chemical vapor deposition (PECVD). The functional polycrystalline silicon structure simultaneously introduces C and N atoms into the silicon bulk and increases the H content in the bulk of the crystalline silicon to reduce the defect states in the bulk and increase the bulk life.

In summary, the present invention has the following beneficial effects compared to the prior art:

(1) The present invention enables the bulk of the silicon wafer to be well passivated. This is because C and N atoms will enter the silicon bulk, and C atoms can effectively reduce the concentration of self-interstitial silicon atoms and avoid the formation of cluster defects; C atoms will also form C—O complexes with O atoms to inhibit the formation of thermal donor defects; N atoms can effectively inhibit the generation of vortex defects and D, defects in the bulk; in addition, C and N atoms have strong H atom capture capabilities, which can retain more H atoms in the silicon bulk and is beneficial to defect passivation.

(2) The present invention enables the surface of the silicon wafer to be excellently passivated. Since N atoms will be enriched to a certain extent at the ultra-thin silicon oxide interface, thanks to the excellent H capture capability of N atoms, the interface H content increases, passivates more defect states, and reduces the density of the interface state; in addition, the H content in C-doped and N-doped polycrystalline silicon is also increased, which is beneficial to surface passivation.

(3) The present invention combines C-doped and N-doped polycrystalline silicon to play different functional roles and simultaneously realizes bulk passivation and surface passivation, thereby obtaining a TOPCon structure with ultra-high passivation performance, with an implicit open-circuit voltage of 760 mV and a minority carrier lifetime of more than 20 ms (an n-type Czochralski (CZ) silicon wafer substrate with a thickness of 110 μm and a resistivity of 1-7 Ω·cm), which is significantly higher than the highest index that can be achieved by a conventional polycrystalline silicon TOPCon structure.

(4) The present invention can also improve the mechanical strength of silicon wafers and reduce the risk of warping of thinner silicon wafers after high-temperature treatment, because N atoms have a strong pinning ability for dislocation, which can effectively prevent the movement of dislocation.

1—crystalline silicon substrate, 2—nano silicon oxide, 3—first polycrystalline silicon layer, 4—second polycrystalline silicon layer, 5—internal diffusion layer, 6—passivation anti-reflection layer.

DETAILED DESCRIPTION OF THE EMBODIMENTS

In order to make the above-mentioned purposes, features, and advantages of the present invention more obvious and easier to understand, the specific embodiments of the present invention are described in detail below in conjunction with the drawings. It should be noted that the following embodiments are only used to illustrate the implementation method and typical parameters of the present invention and are not used to limit the parameter range described in the present invention. Reasonable changes derived therefrom are still within the scope of protection of the claims of the present invention.

It should be noted that the endpoints and any values of the ranges disclosed in the present article are not limited to the precise ranges or values, and these ranges or values should be understood to include values close to these ranges or values. For the numerical range, the endpoint values of each range, and the individual point values can be combined with each other to obtain one or more new numerical ranges, which should be regarded as specifically disclosed in the present article.

The specific embodiment of the present invention provides the functional polycrystalline silicon tunneling silicon oxide passivated contact structure, including the crystalline silicon substrate, the nano silicon oxide, and the functional polycrystalline silicon structure laminated in sequence, and the functional polycrystalline silicon structure includes the carbon and nitrogen co-doped polycrystalline silicon layer or alternating layers of the carbon-doped polycrystalline silicon layer and the nitrogen-doped polycrystalline silicon layer.

Figure 1:
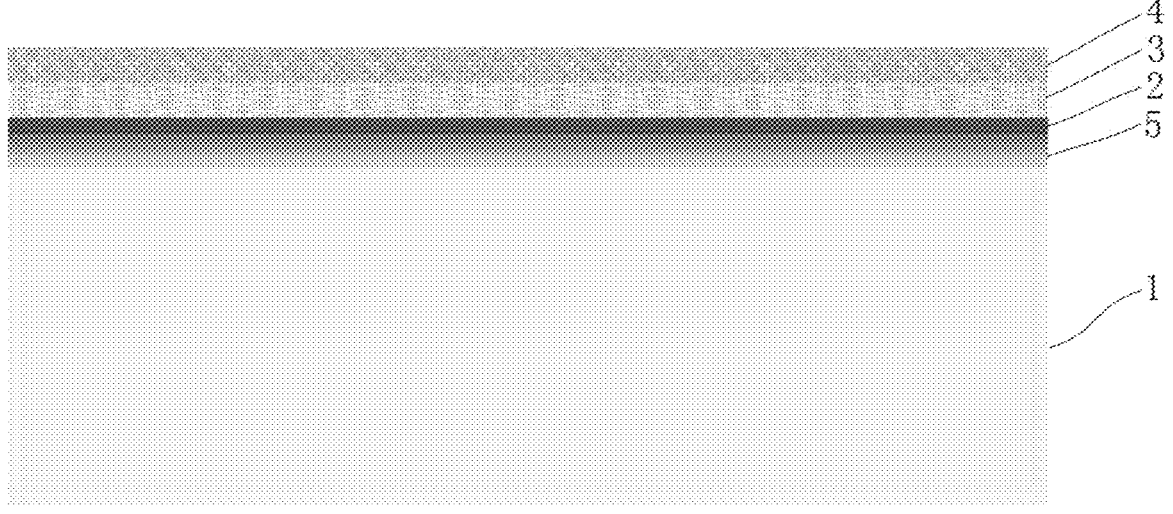
FIG. 1 is a schematic diagram of the structure of a functional polycrystalline silicon tunneling oxide passivated contact structure in a specific embodiment of the present invention.

A typical structure of the functional polycrystalline silicon tunneling silicon oxide passivated contact structure is shown in FIG. 1, including the crystalline silicon substrate 1, nano silicon oxide 2, the first polycrystalline silicon layer 3, and the second polycrystalline silicon layer 4, wherein the first polycrystalline silicon layer 3 and the second polycrystalline silicon layer 4 constitute the functional polycrystalline silicon structure. The material of the first polycrystalline silicon layer 3 is carbon-doped/nitrogen-doped silicon, and the material of the second polycrystalline silicon layer 4 is nitrogen-doped/carbon-doped silicon. The distribution of carbon atoms or nitrogen atoms in the two polycrystalline silicon layers is uniform doping or gradient doping. Carbon-doped polycrystalline silicon and nitrogen-doped polycrystalline silicon form the laminated structure, which plays different functional roles for carbon and nitrogen doped atoms and can simultaneously realize the passivation of the silicon wafer bulk and the surface, thereby obtaining the TOPCon structure with ultra-high passivation performance, and can enhance the mechanical strength of the silicon wafer to a certain extent.

In the specific embodiment, the crystalline silicon substrate 1 is n-type or p-type crystalline silicon. The thickness of the nano silicon oxide 2 is less than 3 nm, which is used to eliminate surface dangling bonds and provide good chemical passivation.

Figure 2:
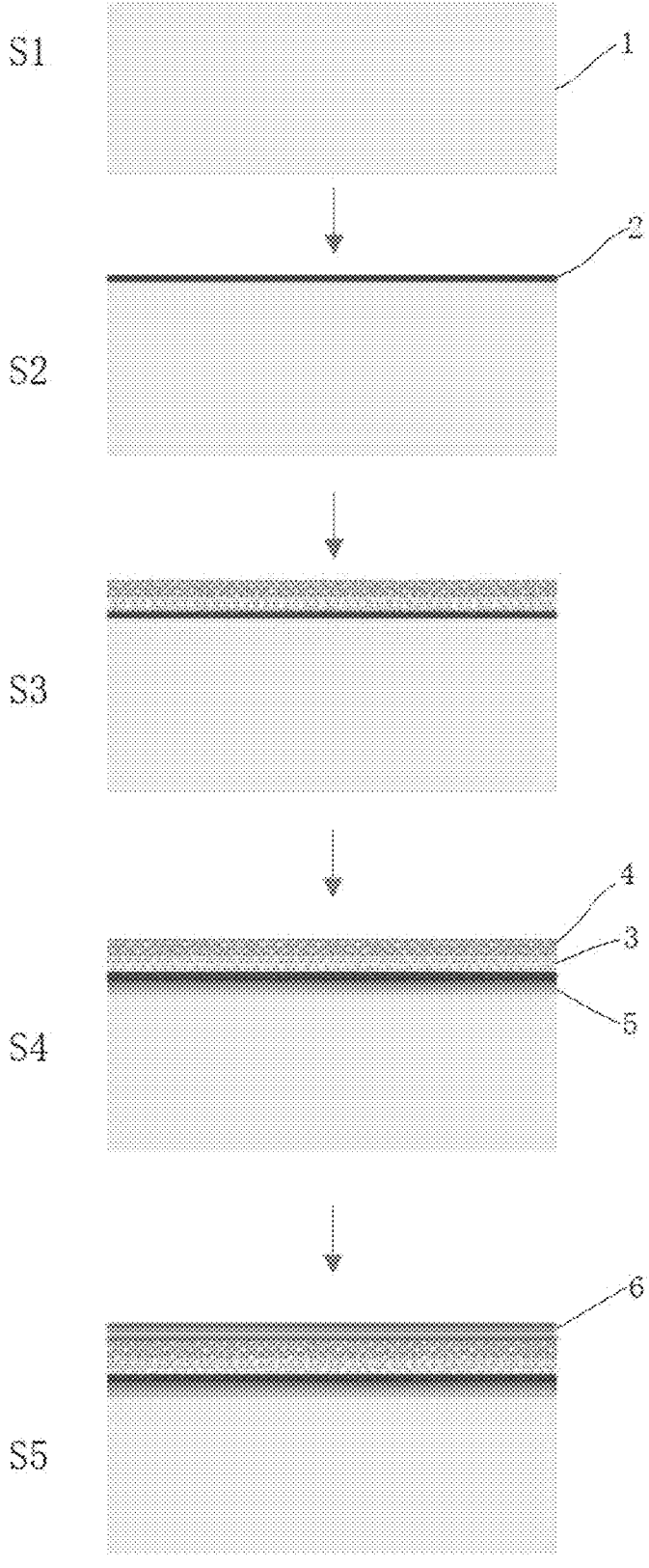
FIG. 2 is a schematic diagram of the process of preparing a functional polycrystalline silicon tunneling oxide passivated contact structure in a specific embodiment of the present invention.

In the specific embodiment, the carbon atoms/nitrogen atoms doping concentration of the first polycrystalline silicon layer 3 is 0.1 at %-50 at %, and the nitrogen atoms/carbon atoms doping concentration of the second polycrystalline silicon layer 4 is 0.1 at %-50 at %; the thickness of the first polycrystalline silicon layer 3 is 1 nm-1000 nm, and the thickness of the second polycrystalline silicon layer 4 is 1 nm-1000 nm. The first polycrystalline silicon layer 3 and the second polycrystalline silicon layer 4 contain the active dopant atom, and the typical p-type active dopant atom is boron, etc., and the doping concentration range is $1E17$-$5E20$ $cm^{-3}$; the typical n-type active dopant atom is phosphorus, and the doping concentration range is $1E18$-$1E21$ $cm^{-3}$, which can achieve an excellent field passivation effect. Preferably, the material of the first polycrystalline silicon layer 3 is carbon-doped polycrystalline silicon, and the material of the second polycrystalline silicon layer 4 is nitrogen-doped polycrystalline silicon. The layer of conventional polycrystalline silicon without carbon/nitrogen doping can also be deposited on the second polycrystalline silicon layer 4 as the third polycrystalline silicon layer to improve contact performance. As shown in FIG. 2, the typical preparation method of the functional polycrystalline silicon tunneling silicon oxide passivated contact structure includes the following steps:

S1, performing standard RCA cleaning, developed by the Radio Corporation of America, on the crystalline silicon substrate 1.

S2, performing $N_2O$ plasma oxidation by the PECVD to deposit ultra-thin silicon oxide on the surface of the crystalline silicon substrate 1 to form nano silicon oxide 2.

S3, performing in-situ deposition by the PECVD to sequentially deposit the first amorphous silicon layer and the second amorphous silicon layer on the surface of the nano silicon oxide 2.

S4, performing high-temperature annealing, with the typical temperature range of 800° C.-1100° C. and the preferred temperature range of 900° C.-950° C., to crystallize the first amorphous silicon layer and the second amorphous silicon layer to form the first polycrystalline silicon layer 3 and the second polycrystalline silicon layer 4, activating active dopant and pushing carbon atoms and nitrogen atoms into the bulk of the crystalline silicon substrate 1, and forming the internal diffusion layer 5 on the surface of the crystalline silicon substrate 1.

S5, depositing aluminum oxide/silicon nitride/aluminum oxide on the second polycrystalline silicon layer 4 by the atomic layer deposition (ALD) and the PECVD to form the passivation anti-reflection layer 6.

The above preparation method can simultaneously introduce C and N atoms into the bulk of the crystalline silicon and increase the H content in the bulk, thereby reducing the defect state in the bulk of the crystalline silicon and improving the bulk life; N atoms are enriched in ultra-thin silicon oxide when diffusing, thereby capturing more H atoms at the interface and reducing the density of the interface state; during the annealing process, the silicon bulk is micro-doped with N, thereby improving the mechanical strength of the silicon wafer and avoiding the warping of the silicon wafer caused by uneven thermal stress. After diffusion, the near-surface region of the crystalline silicon substrate 1 adjacent to the nano silicon oxide 2 contains nitrogen, carbon, hydrogen, and phosphorus/boron elements, and the concentration of each element gradually decreases when the depth increases. The nitrogen concentration at the surface of the crystalline silicon substrate 1 is higher than $1\times10^{20}$ $cm^{-3}$, and can usually exceed $1\times10^{21}$ $cm^{-3}$; the carbon concentration is higher than $1\times10^{20}$ cm$^{-3}$, and can usually exceed $1\times10^{21}$ cm$^{-3}$; the hydrogen concentration is higher than $1\times10^{19}$ cm$^{-3}$, and can usually exceed $1\times10^{20}$ cm$^{-3}$, and the hydrogen concentration is correlated with the distribution of C and N elements. The doping depth of phosphorus/boron is usually between 10 nm and 1000 nm. The doping depth can be controlled within 400 nm by optimizing the annealing temperature and time. Usually, the phosphorus concentration range of the surface of the crystalline silicon substrate 1 is $1\times10^{17}$-$5\times10^{20}$ cm$^{-3}$, and the boron concentration range is $0.5\times10^{17}$-$1\times10^{20}$ cm$^{-3}$.

The prepared functional polycrystalline silicon tunneling silicon oxide passivated contact structure has ultra-high passivation performance. For the n-type silicon wafer substrate with the thickness of 110 μm (with resistivity of 1-7 Ω·cm), its SRH recombination current can be as low as below 0.1 fA/cm$^2$, the single-sided recombination current can be as low as below 0.6 fA/cm$^2$, and the minority carrier lifetime can reach more than 20 ms.

The technical scheme and effects of the present invention are described below through specific embodiments.

Embodiment 1

The N-type crystalline silicon substrate was prepared and subjected to standard RCA cleaning; the ultra-thin silicon oxide layer with the thickness of 2 nm was deposited on the surface of the crystalline silicon substrate by PECVD; the carbon-doped amorphous silicon layer with the thickness of 100 nm and the carbon atom doping concentration of 5 at % was deposited on the surface of the ultra-thin silicon oxide layer by PECVD; the nitrogen-doped amorphous silicon layer with the thickness of 100 nm and the nitrogen atom doping concentration of 5 at % was deposited on the surface of the carbon-doped amorphous silicon layer by PECVD; the high-temperature annealing was performed in the tubular annealing furnace at the temperature of 900° C. for 30 min to form the carbon-doped polycrystalline silicon layer and the nitrogen-doped polycrystalline silicon layer; and the aluminum oxide/silicon nitride/aluminum oxide layer was deposited on the nitrogen-doped polycrystalline silicon layer.

Embodiment 2

The N-type crystalline silicon substrate was prepared and subjected to standard RCA cleaning; the ultra-thin silicon oxide layer with the thickness of 2 nm was deposited on the surface of the crystalline silicon substrate by PECVD; the first carbon-doped amorphous silicon layer with the thickness of 50 nm and the carbon atom doping concentration of 5 at % was deposited on the surface of the ultra-thin silicon oxide layer by PECVD; the first nitrogen-doped amorphous silicon layer with the thickness of 50 nm and the nitrogen atom doping concentration of 5 at % was deposited on the surface of the carbon-doped amorphous silicon layer by PECVD; the second carbon-doped amorphous silicon layer with the thickness of 50 nm and the carbon atom doping concentration of 5 at % was deposited on the surface of the first nitrogen-doped amorphous silicon layer by PECVD; and the second nitrogen-doped amorphous silicon layer with the thickness of 50 nm and the nitrogen atom doping concentration of 5 at % was deposited on the surface of the carbon-doped amorphous silicon layer by PECVD. High-temperature annealing was performed in the tubular annealing furnace at the temperature of 950° C. for 30 min to form the alternating layer structure of the carbon-doped polycrystalline silicon layer and the nitrogen-doped polycrystalline silicon layer. An aluminum oxide/silicon nitride/aluminum oxide layer was deposited on the nitrogen-doped polycrystalline silicon layer.

Embodiment 3

The N-type crystalline silicon substrate was prepared and subjected to standard RCA cleaning; the ultra-thin silicon oxide layer with the thickness of 2 nm was deposited on the surface of the crystalline silicon substrate by PECVD; the nitrogen-doped amorphous silicon layer with the thickness of 100 nm and the nitrogen atom doping concentration of 5 at % was deposited on the surface of the ultra-thin silicon oxide layer by PECVD; the carbon-doped amorphous silicon layer with the thickness of 100 nm and the carbon atom doping concentration of 5 at % was deposited on the surface of the nitrogen-doped amorphous silicon layer by PECVD; the high-temperature annealing was performed in the tubular annealing furnace at the temperature of 900° C. for 30 min to form the nitrogen-doped polycrystalline silicon layer and the carbon-doped polycrystalline silicon layer; and the aluminum oxide/silicon nitride/aluminum oxide layer was deposited on the carbon-doped polycrystalline silicon layer.

Embodiment 4

The N-type crystalline silicon substrate was prepared and subjected to standard RCA cleaning; the ultra-thin silicon oxide layer with the thickness of 2 nm was deposited on the surface of the crystalline silicon substrate by PECVD; the carbon and nitrogen co-doped amorphous silicon layer with the thickness of 300 nm, the carbon atom doping concentration of 5 at % and the nitrogen atom doping concentration of 15 at % was deposited on the surface of the ultra-thin silicon oxide layer by PECVD; the high-temperature annealing was performed in the tubular annealing furnace at the temperature of 1000° C. for 30 min to form the carbon and nitrogen co-doped amorphous silicon layer; and the aluminum oxide/silicon nitride/aluminum oxide layer was deposited on the carbon and nitrogen co-doped amorphous silicon layer.

Comparative Example 1

The N-type crystalline silicon substrate was prepared and subjected to standard RCA cleaning; the ultra-thin silicon oxide layer with the thickness of 2 nm was deposited on the surface of the crystalline silicon substrate by PECVD; the carbon-doped amorphous silicon layer with the thickness of 200 nm and the carbon atom doping concentration of 5 at % was deposited on the surface of the ultra-thin silicon oxide layer by PECVD; the high-temperature annealing was performed in the tubular annealing furnace at the temperature of 900° C. for 30 min to form the carbon-doped polycrystalline silicon layer; and the aluminum oxide/silicon nitride/aluminum oxide layer was deposited on the carbon-doped polycrystalline silicon layer.

Comparative Example 2

The N-type crystalline silicon substrate was prepared and subjected to standard RCA cleaning; the ultra-thin silicon oxide layer with the thickness of 2 nm was deposited on the surface of the crystalline silicon substrate by PECVD; the nitrogen-doped amorphous silicon layer with the thickness of 200 nm and the nitrogen atom doping concentration of 5 at % was deposited on the surface of the ultra-thin silicon oxide layer by PECVD; the high-temperature annealing was performed in the tubular annealing furnace at the temperature of 900° C. for 30 min to form the nitrogen-doped polycrystalline silicon layer; and the aluminum oxide/silicon nitride/aluminum oxide layer was deposited on the nitrogen-doped polycrystalline silicon layer.

Comparative Example 3

The N-type crystalline silicon substrate was prepared and subjected to standard RCA cleaning; the ultra-thin silicon oxide layer with the thickness of 2 nm was deposited on the surface of the crystalline silicon substrate by PECVD; the amorphous silicon layer with the thickness of 200 nm was deposited on the surface of the ultra-thin silicon oxide layer by PECVD; the high-temperature annealing was performed in the tubular annealing furnace at the temperature of 900° C. for 30 min to form the conventional polycrystalline silicon layer; and the aluminum oxide/silicon nitride/aluminum oxide layer was deposited on the polycrystalline silicon layer.

Figure 3:
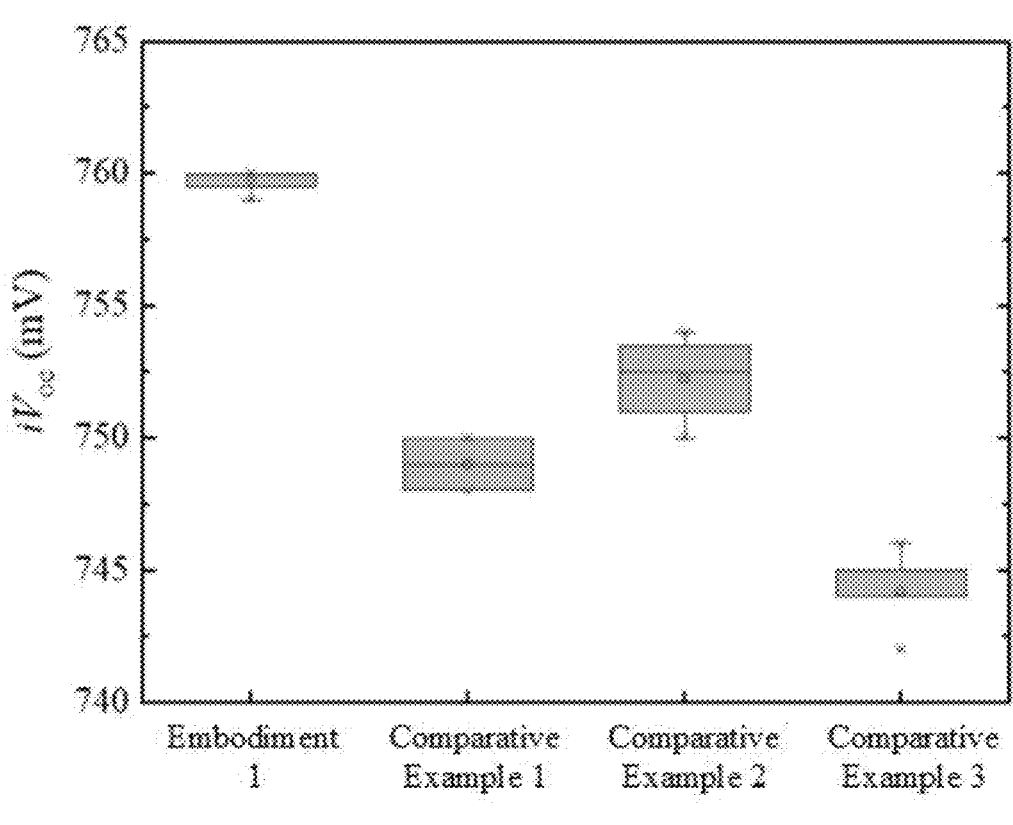
FIG. 3 is a comparison diagram of the implicit open-circuit voltage of the TOPCon structure of the embodiment and the comparative example of the present invention.
Figure 4:
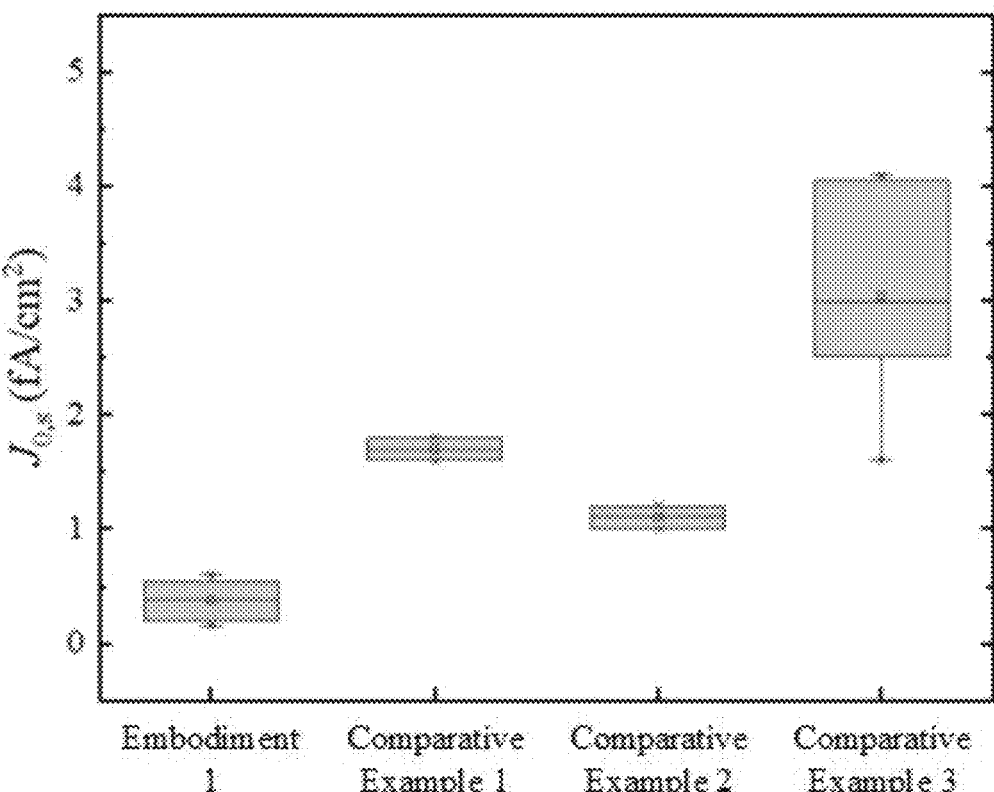
FIG. 4 is a comparison diagram of the single-sided recombination current of the TOPCon structure of the embodiment and the comparative example of the present invention.
Figures 5A, 5B:
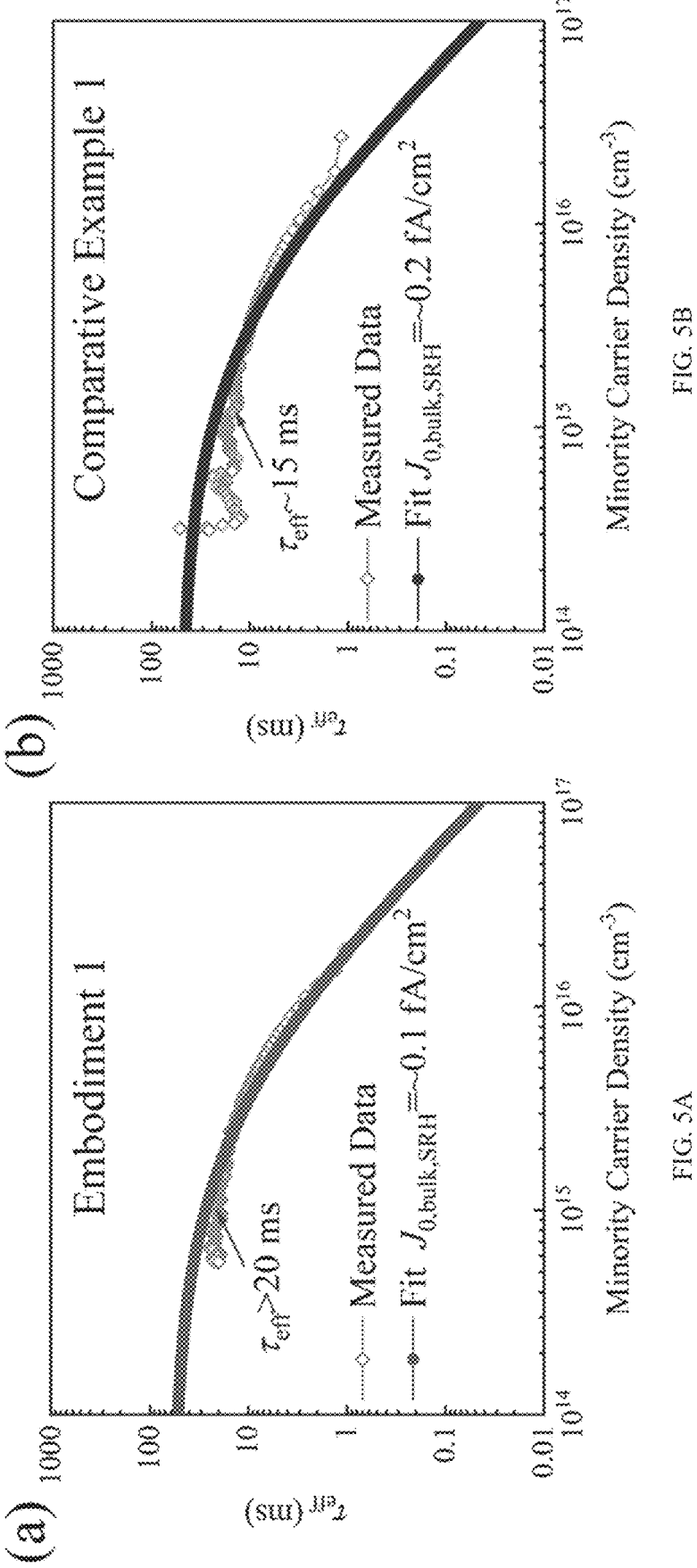
FIGS. 5A-5D are a comparison diagram of the minority carrier lifetime and Shockley-Read-Hall (SRH) recombination current of the TOPCon structure of the embodiment and the comparative example of the present invention.
Figures 5C, 5D:
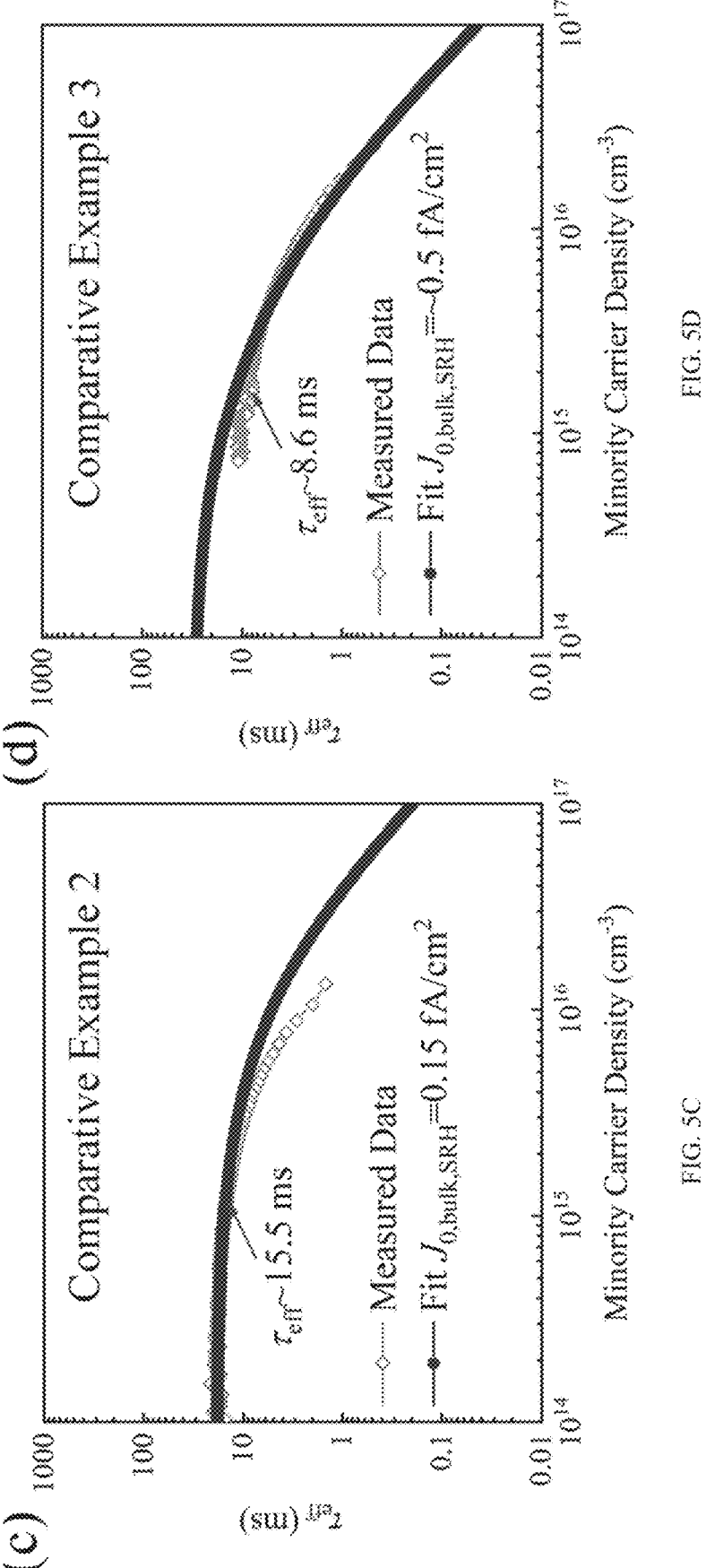
Figure 6:
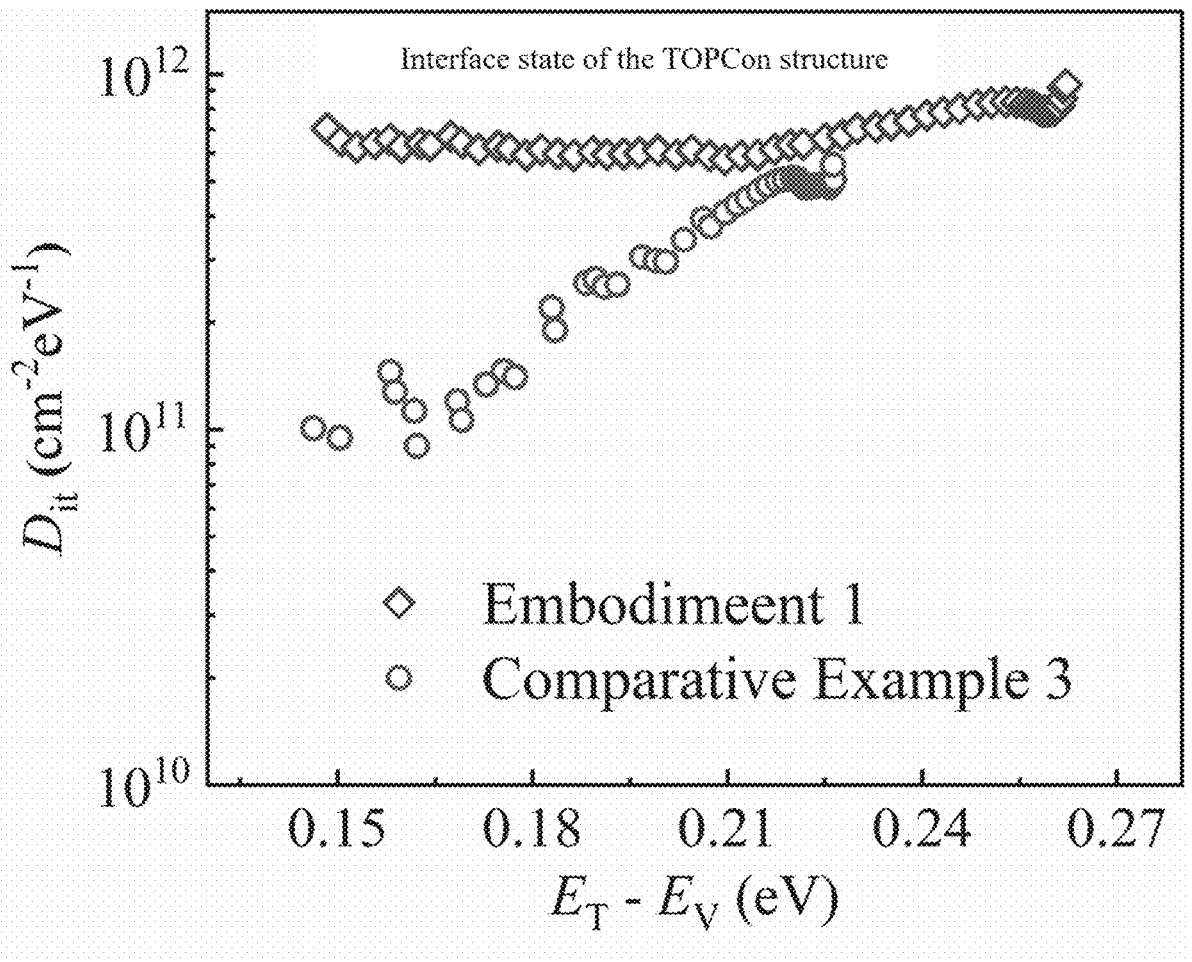
FIG. 6 is a comparison diagram of the interface state density distribution of the TOPCon structure of the embodiment and the comparative example of the present invention.

The performance of the passivated sheets prepared in the above embodiments and comparative examples was tested. The implicit open-circuit voltage $iV_{oc}$ of the sample of embodiment 1 and the samples of comparative examples 1-3 are compared as shown in FIG. 3, the single-sided recombination current $J_{0,s}$ is compared as shown in FIG. 4, and the minority carrier lifetime and SRH recombination current are compared as shown in FIGS. 5A-5D. The results show that the TOPCon structure with carbon-doped and nitrogen-doped laminated polycrystalline silicon has higher implicit open-circuit voltage, lower single-sided recombination current, higher minority carrier lifetime, and lower SRH recombination current than the TOPCon structure of single-layer carbon-doped polycrystalline silicon, nitrogen-doped polycrystalline silicon, or conventional polycrystalline silicon, showing ultra-high passivation performance. The interface state density distribution comparison of the sample of embodiment 1 and the sample of comparative example 3 is shown in FIG. 6. The results show that carbon-doped and nitrogen-doped laminated polycrystalline silicon can reduce the density of the interface state and make the surface of the silicon wafer excellently passivated.

The methods of embodiments 1-4 and comparative examples 1-3 were used to prepare TOPCon cells respectively, and the performance of each cell was tested. The results are shown in Table 1 below. The results show that the functional polycrystalline silicon structure can improve the open-circuit voltage, fill factor, and cell conversion efficiency of the TOPCon cell.

Table 1 Comparison of cell performance between Embodiment 1-3 and Comparative Examples 1-3

|  | $V_{oc}$(mV) | $J_{sc}$(mA/cm$^2$) | FF (%) | Eff.(%) |
|---|---|---|---|---|
| Embodiment 1 | 725.0 | 42.2 | 85.47 | 26.15% |
| Embodiment 2 | 725.4 | 42.3 | 85.72 | 26.30% |
| Embodiment 3 | 723.8 | 42.2 | 85.40 | 26.08% |
| Embodiment 4 | 725.1 | 42.3 | 85.56 | 26.21% |
| Comparative Example 1 | 721.9 | 42.2 | 85.33 | 25.99% |
| Comparative Example 2 | 722.5 | 42.2 | 85.38 | 26.03% |
| Comparative Example 3 | 721.2 | 42.1 | 85.31 | 25.90% |

Although the present invention is disclosed as above, the present invention is not limited thereto. Any person skilled in the art can make various changes and modifications without departing from the spirit and scope of the present invention. Therefore, the protection scope of the present invention shall be subject to the scope defined by the claims.

What is claimed is:

1. A functional polycrystalline silicon tunneling silicon oxide passivated contact structure, comprising
   a crystalline silicon substrate,
   a nano silicon oxide on a surface of the crystalline silicon substrate, and
   a functional polycrystalline silicon structure on the nano silicon oxide and laminated in sequence, wherein
   the functional polycrystalline silicon structure comprises a carbon and nitrogen co-doped polycrystalline silicon layer, or alternating layers of a carbon-doped polycrystalline silicon layer and a nitrogen-doped polycrystalline silicon layer; and wherein
   a near surface region of the crystalline silicon substrate adjacent to the nano silicon oxide comprises a nitrogen element, a carbon element, a hydrogen element, and a phosphorus element or a boron element;
   a nitrogen concentration at a surface of the crystalline silicon substrate is higher than $1 \times 10^{20}$ cm$^{-3}$,
   a carbon concentration at the surface of the crystalline silicon substrate is higher than $1 \times 10^{20}$ cm$^{-3}$, and
   a hydrogen concentration at the surface of the crystalline silicon substrate is higher than $1 \times 10^{19}$ cm$^{-3}$.

2. The functional polycrystalline silicon tunneling silicon oxide passivated contact structure according to claim 1, wherein the carbon and nitrogen co-doped polycrystalline silicon layer or the alternating layers of the carbon-doped polycrystalline silicon layer and the nitrogen-doped polycrystalline silicon layer in the functional polycrystalline silicon structure further comprises an active dopant atom, and the active dopant atom is phosphorus or boron.

3. The functional polycrystalline silicon tunneling silicon oxide passivated contact structure according to claim 1, wherein a phosphorus concentration range at the surface of the crystalline silicon substrate is $1 \times 10^{17}$-$5 \times 10^{20}$ cm$^{-3}$ or a boron concentration range at the surface of the crystalline silicon substrate is $0.5 \times 10^{17}$-$1 \times 10^{20}$ cm$^{-3}$; and a concentration of the nitrogen element, the carbon element, the hydrogen element, and the phosphorus element or the boron element in the crystalline silicon substrate gradually decreases as depth increases in a direction away from the near surface region of the crystalline silicon substrate adjacent to the nano silicon oxide.

4. The functional polycrystalline silicon tunneling silicon oxide passivated contact structure according to claim 1, wherein, when the functional polycrystalline silicon structure comprises the carbon and nitrogen co-doped polycrystalline silicon layer, a carbon atom doping concentration of the carbon and nitrogen co-doped polycrystalline silicon layer is 0.1-50 at % and a nitrogen atom doping concentration of the carbon and nitrogen co-doped polycrystalline silicon layer is 0.1-50 at %; and wherein, when the functional polycrystalline silicon structure comprises the alternating layers of the carbon-doped polycrystalline silicon layer and the nitrogen-doped polycrystalline silicon layer, a carbon atom doping concentration of the carbon-doped polycrystalline silicon layer is 0.1-50 at % and a nitrogen atom doping concentration of the nitrogen-doped polycrystalline silicon layer is 0.1-50 at %.

5. The functional polycrystalline silicon tunneling silicon oxide passivated contact structure according to claim 4, wherein, when the functional polycrystalline silicon structure comprises the carbon and nitrogen co-doped polycrystalline silicon layer, a distribution of carbon atoms and nitrogen atoms in the carbon and nitrogen co-doped polycrystalline silicon layer is a uniform doping or a gradient doping; and wherein, when the functional polycrystalline silicon structure comprises the alternating layers of the carbon-doped polycrystalline silicon layer and the nitrogen-doped polycrystalline silicon layer, a distribution of carbon atoms in the carbon-doped polycrystalline silicon layer is the uniform doping or the gradient doping, and a distribution of nitrogen atoms in the nitrogen-doped polycrystalline silicon layer is the uniform doping or the gradient doping.

6. The functional polycrystalline silicon tunneling silicon oxide passivated contact structure according to claim 4, wherein, when the functional polycrystalline silicon structure comprises the carbon and nitrogen co-doped polycrystalline silicon layer, a thickness of the carbon and nitrogen co-doped polycrystalline silicon layer is 1 nm-1000 nm; and wherein, when the functional polycrystalline silicon structure comprises the alternating layers of the carbon-doped polycrystalline silicon layer and the nitrogen-doped polycrystalline silicon layer, a thickness of the carbon-doped polycrystalline silicon layer is 1 nm-1000 nm, and a thickness of the nitrogen-doped polycrystalline silicon layer is 1 nm-1000 nm.

7. The functional polycrystalline silicon tunneling silicon oxide passivated contact structure according to claim 1, wherein a conventional polycrystalline silicon layer is further provided on the functional polycrystalline silicon structure, and a material of the conventional polycrystalline silicon layer is a polycrystalline silicon not doped with carbon or nitrogen.

8. The functional polycrystalline silicon tunneling silicon oxide passivated contact structure according to claim 2, wherein, when the functional polycrystalline silicon structure comprises the carbon and nitrogen co-doped polycrystalline silicon layer, a carbon atom doping concentration of the carbon and nitrogen co-doped polycrystalline silicon layer is 0.1-50 at % and a nitrogen atom doping concentration of the carbon and nitrogen co-doped polycrystalline silicon layer is 0.1-50 at %; and wherein, when the functional polycrystalline silicon structure comprises the alternating layers of the carbon-doped polycrystalline silicon layer and the nitrogen-doped polycrystalline silicon layer, a carbon atom doping concentration of the carbon-doped polycrystalline silicon layer is 0.1-50 at % and a nitrogen atom doping concentration of the nitrogen-doped polycrystalline silicon layer is 0.1-50 at %.

9. The functional polycrystalline silicon tunneling silicon oxide passivated contact structure according to claim 3, wherein, when the functional polycrystalline silicon structure comprises the carbon and nitrogen co-doped polycrystalline silicon layer, a carbon atom doping concentration of the carbon and nitrogen co-doped polycrystalline silicon layer is 0.1-50 at % and a nitrogen atom doping concentration of the carbon and nitrogen co-doped polycrystalline silicon layer is 0.1-50 at %; and wherein, when the functional polycrystalline silicon structure comprises the alternating layers of the carbon-doped polycrystalline silicon layer and the nitrogen-doped polycrystalline silicon layer, a carbon atom doping concentration of the carbon-doped polycrystalline silicon layer is 0.1-50 at % and a nitrogen atom doping concentration of the nitrogen-doped polycrystalline silicon layer is 0.1-50 at %.

10. The functional polycrystalline silicon tunneling silicon oxide passivated contact structure according to claim 2, wherein a conventional polycrystalline silicon layer is further provided on the functional polycrystalline silicon structure, and a material of the conventional polycrystalline silicon layer is a polycrystalline silicon not doped with carbon or nitrogen.

11. The functional polycrystalline silicon tunneling silicon oxide passivated contact structure according to claim 3, wherein a conventional polycrystalline silicon layer is further provided on the functional polycrystalline silicon structure, and a material of the conventional polycrystalline silicon layer is a polycrystalline silicon not doped with carbon or nitrogen.

12. A preparation method of the functional polycrystalline silicon tunneling silicon oxide passivated contact structure according to claim 1, comprising the following steps:

S1, cleaning the crystalline silicon substrate;

S2, depositing the nano silicon oxide on a surface of the crystalline silicon substrate;

S3, depositing a carbon and nitrogen co-doped amorphous silicon layer or alternating layers of a carbon-doped amorphous silicon layer and a nitrogen-doped amorphous silicon layer on a surface of the nano silicon oxide; and S4, performing a high-temperature annealing to crystallize an amorphous silicon to form the functional polycrystalline silicon structure, and pushing carbon atoms and nitrogen atoms into a bulk of the crystalline silicon substrate.

13. The preparation method of the functional polycrystalline silicon tunneling silicon oxide passivated contact structure according to claim 12, wherein in the step S4, a temperature of the high-temperature annealing is 800° C.-1100° C.

14. The preparation method of the functional polycrystalline silicon tunneling silicon oxide passivated contact structure according to claim 13, wherein in the step S3, the carbon and nitrogen co-doped amorphous silicon layer or the alternating layers of the carbon-doped amorphous silicon layer and the nitrogen-doped amorphous silicon layer are deposited in situ by a plasma-enhanced chemical vapor deposition.

15. The preparation method of the functional polycrystalline silicon tunneling silicon oxide passivated contact structure according to claim 12, wherein in the functional polycrystalline silicon tunneling silicon oxide passivated contact structure, the carbon and nitrogen co-doped polycrystalline silicon layer or the alternating layers of the carbon-doped polycrystalline silicon layer and the nitrogen-doped polycrystalline silicon layer further comprises an active dopant atom, and the active dopant atom is phosphorus or boron.

16. The preparation method of the functional polycrystalline silicon tunneling silicon oxide passivated contact structure according to claim 15, wherein in the functional polycrystalline silicon tunneling silicon oxide passivated contact structure a phosphorus concentration range at the surface of the crystalline silicon substrate is $1 \times 10^{17}$-$5 \times 10^{20}$ cm$^{-3}$ or a boron concentration range at the surface of the crystalline silicon substrate is $0.5 \times 10^{17}$-$1 \times 10^{20}$ cm$^{-3}$; and a concentration of the nitrogen element, the carbon element, the hydrogen element, and the phosphorus element or the boron element in the crystalline silicon substrate gradually decreases as depth increases in a direction away from the near surface region of the crystalline silicon substrate adjacent to the nano silicon oxide.

17. The preparation method of the functional polycrystalline silicon tunneling silicon oxide passivated contact structure according to claim 12, wherein, in the functional polycrystalline silicon tunneling silicon oxide passivated contact structure, when the functional polycrystalline silicon structure comprises the carbon and nitrogen co-doped polycrystalline silicon layer, a carbon atom doping concentration of the carbon and nitrogen co-doped polycrystalline silicon layer is 0.1-50 at % and a nitrogen atom doping concentration of the carbon and nitrogen co-doped polycrystalline silicon layer is 0.1-50 at %; and wherein, when the functional polycrystalline silicon structure comprises the alternating layers of the carbon-doped polycrystalline silicon layer and the nitrogen-doped polycrystalline silicon layer, a carbon atom doping concentration of the carbon-doped polycrystalline silicon layer is 0.1-50 at % and a nitrogen atom doping concentration of the nitrogen-doped polycrystalline silicon layer is 0.1-50 at %.

18. The preparation method of the functional polycrystalline silicon tunneling silicon oxide passivated contact structure according to claim 17, wherein, in the functional polycrystalline silicon tunneling silicon oxide passivated contact structure, when the functional polycrystalline silicon structure comprises the carbon and nitrogen co-doped polycrystalline silicon layer, a distribution of the carbon atoms and the nitrogen atoms in the carbon and nitrogen co-doped polycrystalline silicon layer is a uniform doping or a gradient doping; and wherein, when the functional polycrystalline silicon structure comprises the alternating layers of the carbon-doped polycrystalline silicon layer and the nitrogen-doped polycrystalline silicon layer, a distribution of the carbon atoms in the carbon-doped polycrystalline silicon layer is the uniform doping or the gradient doping, and a distribution of the nitrogen atoms in the nitrogen-doped polycrystalline silicon layer is the uniform doping or the gradient doping.

19. The preparation method of the functional polycrystalline silicon tunneling silicon oxide passivated contact structure according to claim 17, wherein, in the functional polycrystalline silicon tunneling silicon oxide passivated contact structure, when the functional polycrystalline silicon structure comprises the carbon and nitrogen co-doped polycrystalline silicon layer, a thickness of the carbon and nitrogen co-doped polycrystalline silicon layer is 1 nm-1000 nm; and wherein, when the functional polycrystalline silicon structure comprises the alternating layers of the carbon-doped polycrystalline silicon layer and the nitrogen-doped polycrystalline silicon layer, a thickness of the carbon-doped polycrystalline silicon layer is 1 nm-1000 nm, and a thickness of the nitrogen-doped polycrystalline silicon layer is 1 nm-1000 nm.

20. The preparation method of the functional polycrystalline silicon tunneling silicon oxide passivated contact structure according to claim 12, wherein in the functional polycrystalline silicon tunneling silicon oxide passivated contact structure, a conventional polycrystalline silicon layer is further provided on the functional polycrystalline silicon structure, and a material of the conventional polycrystalline silicon layer is a polycrystalline silicon not doped with carbon or nitrogen.

\* \* \* \* \*